United States Patent
Rozeau et al.

(10) Patent No.: US 10,914,703 B2
(45) Date of Patent: Feb. 9, 2021

(54) COMPUTER IMPLEMENTED METHOD FOR DETERMINING INTRINSIC PARAMETER IN A STACKED NANOWIRES MOSFET

(71) Applicant: COMMISSARIAT A L'ENERGIE ATOMIQUE ET AUX ENERGIES ALTERNATIVES, Paris (FR)

(72) Inventors: Olivier Rozeau, Moirans (FR); Marie-Anne Jaud, Claix (FR); Joris Lacord, La Murette (FR); Sébastien Martinie, Saint-Martin le Vinoux (FR); Thierry Poiroux, Voiron (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 350 days.

(21) Appl. No.: 15/827,206

(22) Filed: Nov. 30, 2017

(65) Prior Publication Data
US 2018/0156749 A1 Jun. 7, 2018

Related U.S. Application Data

(60) Provisional application No. 62/429,212, filed on Dec. 2, 2016.

(51) Int. Cl.
*G01N 27/22* (2006.01)
*G01B 21/08* (2006.01)
(Continued)

(52) U.S. Cl.
CPC ............ *G01N 27/228* (2013.01); *B82Y 10/00* (2013.01); *G01B 15/02* (2013.01); *G01B 21/08* (2013.01);
(Continued)

(58) Field of Classification Search
CPC ......... B82Y 10/00; B82Y 30/00; B82Y 35/00; G06F 17/5045; H01J 37/26;
(Continued)

(56) References Cited

U.S. PATENT DOCUMENTS

2014/0353574 A1* 12/2014 Li .................... H01L 29/0673
257/9

OTHER PUBLICATIONS

Karl-Magnus Persson et al., Extrinsic and Intrinsic Performance of Vertical InAs Nanowire MOSFETs on Si Substrates, Sep. 2013, IEEE Transaction on Electron Devices, vol. 60, issue 9, pp. 2761-2767.*

(Continued)

*Primary Examiner* — Mischita L Henson
(74) *Attorney, Agent, or Firm* — Pillsbury Winthrop Shaw Pittman LLP

(57) ABSTRACT

Embodiments of the invention determine intrinsic parameters of stacked nanowires/nanosheets GAA MOSFETs comprising $N_w$ nanowires and/or nanosheets, each nanowire/nanosheet being surrounded in an oxide layer, the oxide layers being embedded in a common gate, wherein the method comprises the following steps:
    measuring the following parameters of the MOSFET:
        number of stacked nanowires/nanosheets $N_w$,
        width $W_{W,i}$, of the nanowire/nanosheet number i, i being an integer from 1 to $N_w$,
        thickness of the nanowire/nanosheet $H_{W,i}$, number i, i being an integer from 1 to $N_w$,
        corner radius $R_{W,i}$ of the nanowire/nanosheet number i, i being an integer from 1 to $N_w$, $R_{W,i}$;
    calculating, using a processor and the measured parameters, a surface potential x normalized by a thermal voltage $\phi_T$ given by $\phi_T = k_B T/q$;
    measuring the total gate capacitance for a plurality of gate voltages;

(Continued)

determining, using the measured total gate capacitance and the calculated normalized surface potential, the intrinsic parameter of the stacked nanowires/nanosheets MOSFET.

14 Claims, 7 Drawing Sheets

(51) Int. Cl.

| | |
|---|---|
| *G01B 15/02* | (2006.01) |
| *H01L 29/423* | (2006.01) |
| *H01L 29/66* | (2006.01) |
| *H01L 29/06* | (2006.01) |
| *H01L 29/775* | (2006.01) |
| *H01L 29/786* | (2006.01) |
| *G01N 23/2251* | (2018.01) |
| *B82Y 10/00* | (2011.01) |
| *G01R 29/24* | (2006.01) |
| *B82Y 35/00* | (2011.01) |
| *B82Y 30/00* | (2011.01) |
| *G01R 31/26* | (2020.01) |

(52) U.S. Cl.
CPC ....... *G01N 23/2251* (2013.01); *G01N 27/221* (2013.01); *H01L 29/0673* (2013.01); *H01L 29/42392* (2013.01); *H01L 29/66439* (2013.01); *H01L 29/775* (2013.01); *H01L 29/78696* (2013.01); *B82Y 30/00* (2013.01); *B82Y 35/00* (2013.01); *G01B 2210/56* (2013.01); *G01R 29/24* (2013.01); *G01R 31/2603* (2013.01); *G01R 31/2621* (2013.01); *Y10S 977/755* (2013.01); *Y10S 977/762* (2013.01); *Y10S 977/881* (2013.01); *Y10S 977/901* (2013.01); *Y10S 977/938* (2013.01)

(58) Field of Classification Search
CPC ......... H01L 29/42392; H01L 29/66439; H01L 29/775; H01L 29/0673; H01L 29/78696; G01B 2210/56; G01B 21/08; G01B 15/02; G01R 31/2603; G01R 29/24; G01R 31/2621; G01N 27/221; G01N 27/228; G01N 23/2251; Y10S 977/938; Y10S 977/762; Y10S 977/901; Y10S 977/755; Y10S 977/881
See application file for complete search history.

(56) References Cited

OTHER PUBLICATIONS

Aleandro Antidormi et al., Computationally Efficient Multiple-Independent-Gate Device Model, Jan. 2016, IEEE Transactions on Nanotechnology, vol. 15, No. 1, pp. 2-14.*

* cited by examiner

COMPUTER IMPLEMENTED METHOD FOR DETERMINING INTRINSIC PARAMETER IN A STACKED NANOWIRES MOSFET

CROSS-REFERENCE TO RELATED APPLICATION

This application claims priority to U.S. Provisional Patent Application No. 62/429,212, filed Dec. 2, 2016, the entire contents of which is incorporated herein by reference in its entirety.

FIELD

This invention relates to a computer implemented method for determining at least one intrinsic parameter in stacked nanowires/nanosheets gate-all-around (GAA) MOSFETs (Metal Oxide Semiconductor Field Effect Transistors). A stacked nanowires/nanosheets GAA MOSFET is a transistor comprising at least two wires/sheets, each wire/sheet being surrounded by an oxide layer, the oxide layers being embedded by a common gate.

BACKGROUND

Stacked nanowires/nanosheets gate-all-around MOSFET is a good candidate to replace FinFET for sub-7 nm CMOS nodes. Each nanowire/nanosheet can have a shape from cylindrical nanowire to nanosheet with wide width depending of the applications: low power to high speed applications. However, there is currently no calculation method to reproduce the electrical characteristics of these devices. As a consequence, tools are not available to characterize intrinsic properties, to design integrated circuits on CMOS technology using GAA transistors architectures encasing stacked nanowires MOSFET, to optimize the device architecture with regard to the consumption, performance, and surface technology targets of the circuits.

SUMMARY

An aspect of the invention aims at providing a tool for determining at least one intrinsic parameter of a stacked nanowires/nanosheets MOSFET, such as the equivalent thickness gate, interface states, the gate oxide permittivity, or the carrier mobility by using surface potentials, drain current and charges, which is robust, accurate and with low computation time. An intrinsic parameter may be defined as a parameter which cannot be measurable directly (e.g., by standard, known measurements used in microelectronics). According to the known in the art solution, the use of methods for other MOSFET architectures like bulk MOSFET do not allow to determine accurately the surface potentials and by consequence the channel current and charges in the case of stacked nanowires/nanosheets GAA MOSFET. As a consequence, these other methods will introduce significant errors on intrinsic parameters.

To that purpose, a first aspect of the invention concerns a computer implemented method for determining at least one intrinsic parameter of a stacked nanowires/nanosheets MOSFET Then, these intrinsic parameters are used to reproduce electrical characteristics in all biasing with a computer associated to a dedicated set of equations, such as drain output current versus gate and drain voltages. These ones are used to simulate integrated circuits with many transistors, where the layout of each transistor can be adapted to optimize its electrical properties with respect to circuit performance and power consumption. Typically, an integrated circuit designer can choose the optimal transistor sizes needed for a circuit. But without sufficient accuracy of the intrinsic parameters, the device characteristics cannot be correctly evaluated by simulations. Consequently, the circuit optimization would fail; knowledge of intrinsic parameter(s) is thus necessary for integrated circuit simulations and transistor design optimizations.

The stacked nanowires/nanosheets MOSFET comprises $N_w$ nanowires and/or nanosheets, each nanowire/nanosheet being surrounded in an oxide layer, the oxide layers being embedded in a common gate, wherein the method comprises the following steps:
measuring by at least one imaging method the following geometrical parameters of the MOSFET:
the number of stacked nanowires/nanosheets $N_w$,
the width $W_{W,i}$ of the nanowire/nanosheet number i, i being an integer starting from 1 to $N_w$,
the thickness of the nanowire/nanosheet $H_{W,i}$, number i, i being an integer starting from 1 to $N_w$,
the corner radius $R_{W,i}$ of the nanowire/nanosheet number i, i being an integer starting from 1 to $N_w$, $R_{W,i}$;
calculating, using a physical processor and the measured geometrical parameters, a surface potential x normalized by a thermal voltage $\phi_T$ given by $\phi_T = k_B T/q$;
measuring electrically the total gate capacitance for several gate voltage;
determining, using the measured total gate capacitance and the calculated normalized surface potential, the intrinsic parameter of the stacked nanowires/nanosheets MOSFET.

The method enables to define unique surface potentials for reducing computing time, even if the surface potential is not constant around the nanowire.

According to the method, a unique equivalent surface potential is considered even if the surface potential is not constant around each nanowire. To that purpose, each nanowire is cut in three parts:
a center part similar to a symmetric double-gate MOSFET;
2 corners parts, similar to a quasi-cylindrical nanowire.

The method may then comprise the following steps:
calculate the total channel width (e.g., effective width) of stacked nanowire MOSFET;
defining geometrical variables for surface potential calculation;
finding analytical solutions for the surface potentials along the channel;
finding analytical formulations of current and charges for unique or stacked nanowires with width variations.

DETAILED DESCRIPTION

Figure 1:
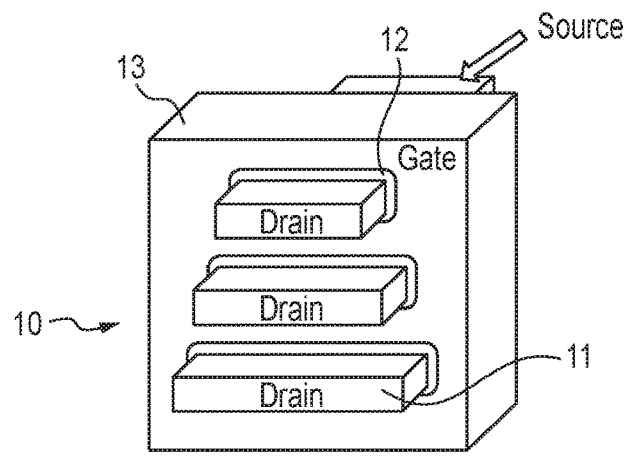
FIG. 1 is a schematic representation of a stacked nanowires/nanosheets GAA MOSFET to which a method according to one embodiment of the invention may be applied.
Figure 2:
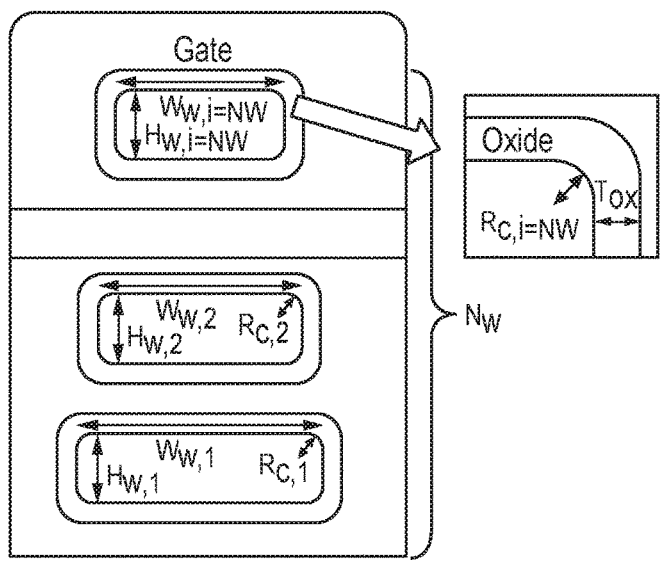
FIG. 2 is a cross-section view of the stacked nanowires/nanosheet GAA MOSFET of FIG. 1.

FIGS. 1 and 2 schematically represent a stacked nanowire MOSFET to which a method according to one embodiment of the invention may be applied to determine surface potential in the transistor.

This stacked nanowires/nanosheets GAA MOSFET 10 comprises at least one nanowire 11 forming a drain, a source and a channel. All drains are same potential. All sources are same potential. Each nanowire 11 is surrounded by an oxide film 12. The stacked nanowire MOSFET also comprises a common gate 13 surrounding the oxide layers.

Figure 3:
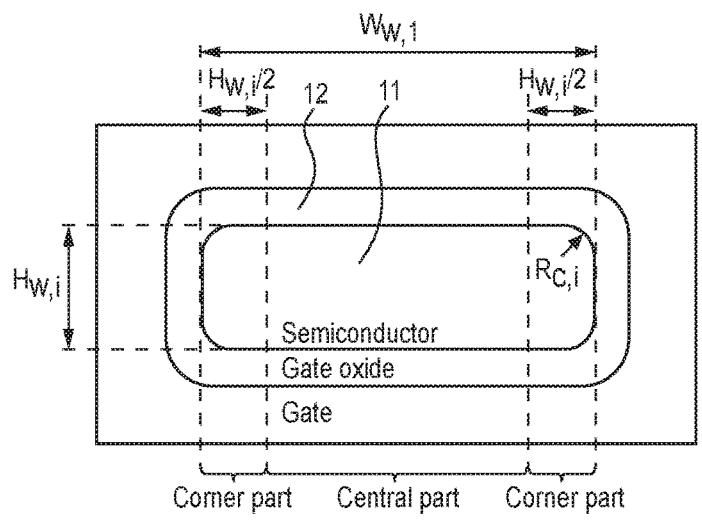
FIG. 3 is an enlarged view of a nanowire/nanosheet of the stacked nanowires/nanosheets GAA MOSFET of FIGS. 1 and 2.
Figure 4:
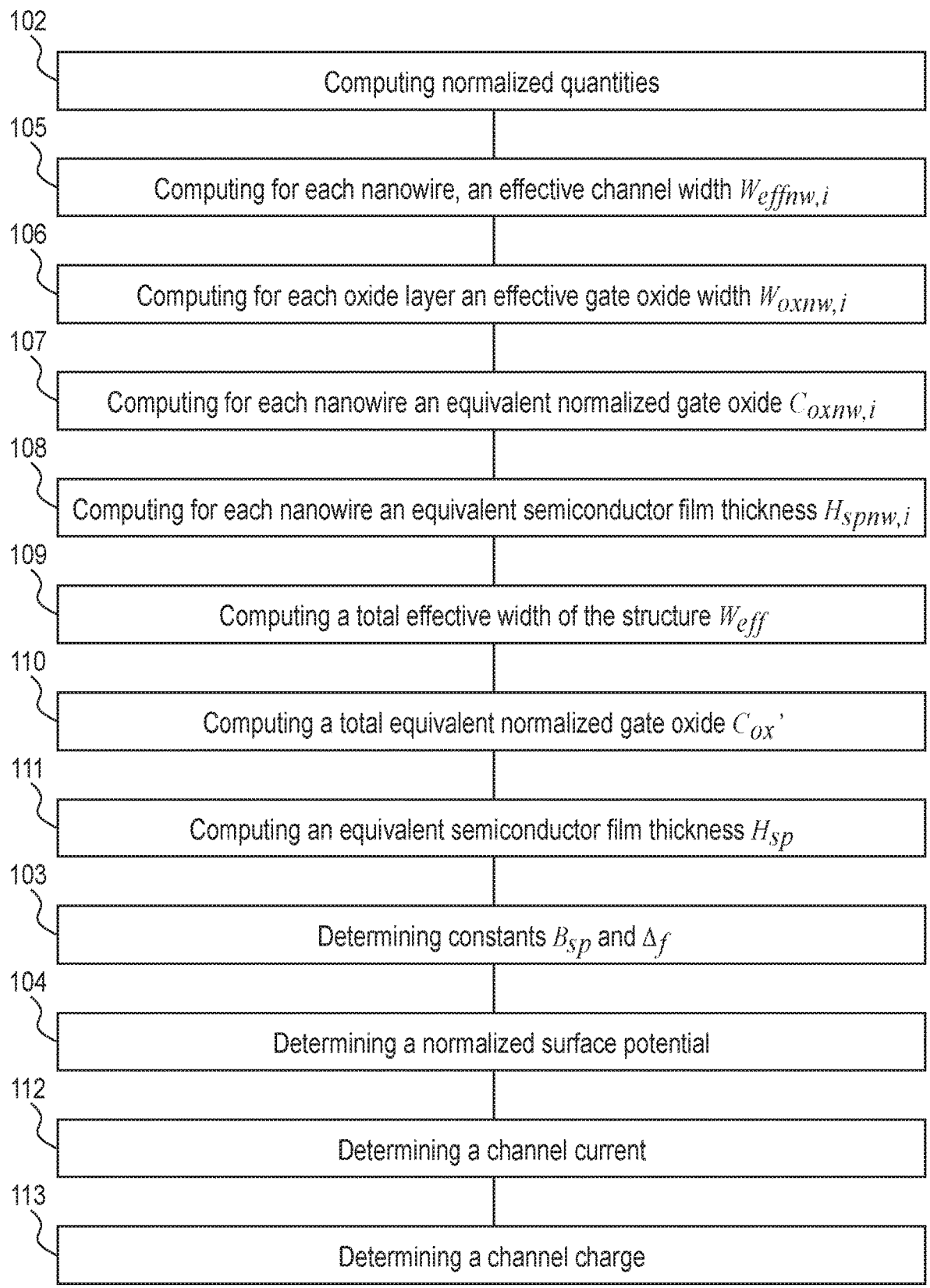
FIG. 4 represents the steps of a method according to one embodiment of the invention.
Figure 5A:
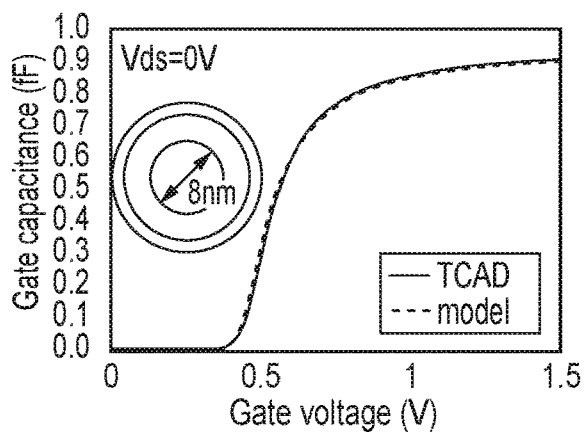
FIG. 5(*a*) represents the evolution of gate capacitance versus gate voltage of a nanowire GAA MOSFET comprising a unique nanowire with a cylindrical section, obtained by a method according to one embodiment of the invention and by a simulation of the prior art.
FIG. 5(b) represents the evolution of gate capacitance versus gate voltage of a nanowire GAA MOSFET comprising a unique nanowire with a square section with rounded corners, obtained by a method according to one embodiment of the invention and by a simulation of the prior art.
Figure 5B:
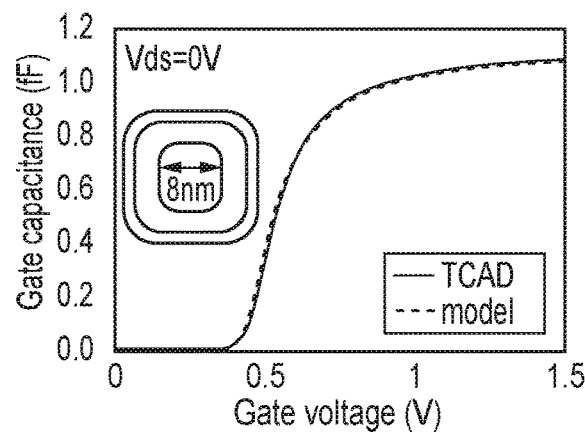
Figure 6A:
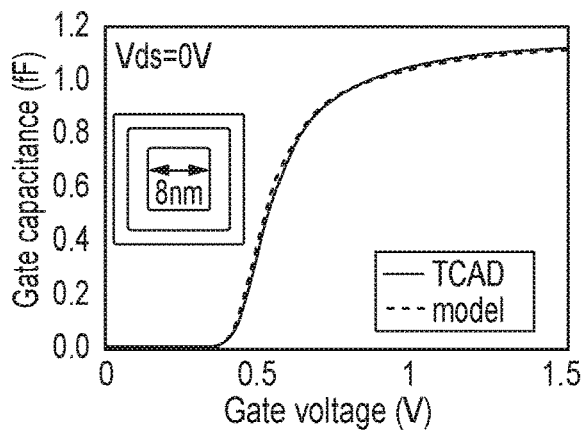
FIG. 6(a) represents the evolution of gate capacitance versus gate voltage of a nanowire GAA MOSFET comprising a unique nanowire with a square section obtained by a method according to one embodiment of the invention and by a simulation of the prior art.
Figure 6B:
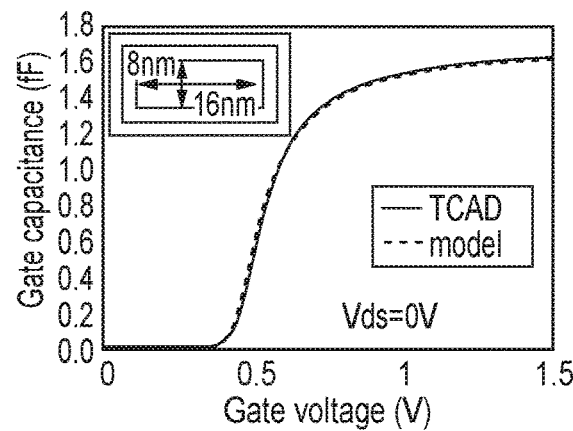
FIG. 6(b) represents the evolution of gate capacitance versus gate voltage of a nanowire GAA MOSFET comprising a unique nanosheet with a rectangular section, obtained by a method according to one embodiment of the invention and by a simulation of the prior art.
Figure 7A:
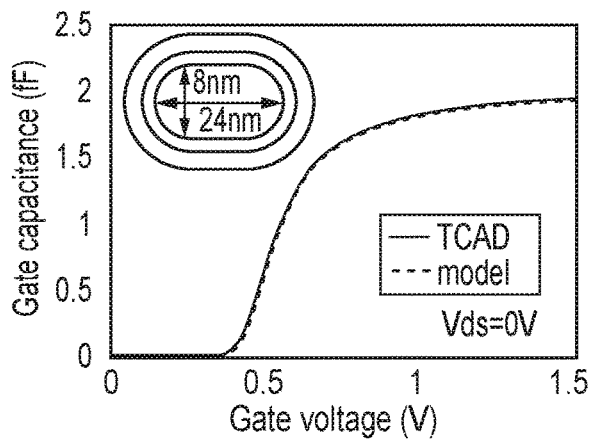
FIG. 7(a) represents the evolution of gate capacitance versus gate voltage of a nanowire GAA MOSFET comprising a unique nanosheet with a rectangular section and rounded corners obtained by a method according to one embodiment of the invention and by a simulation of the prior art.
Figure 7B:
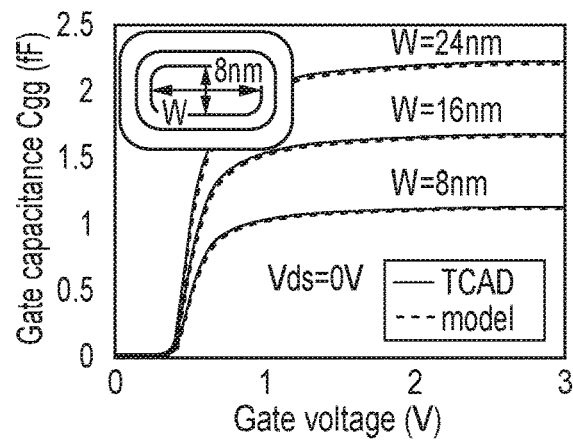
FIG. 7(b) represents the evolution of gate capacitance versus gate voltage, of another nanowire GAA MOSFET comprising a unique nanosheet with a rectangular section and rounded corners for three width values, obtained by a method according to one embodiment of the invention and by a simulation of the prior art.
Figure 8A:
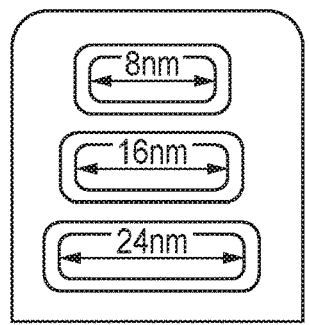
FIG. 8(a) represents a stacked nanosheet GAA MOSFET to which a method according to one embodiment of this invention is applied.
Figure 8B:
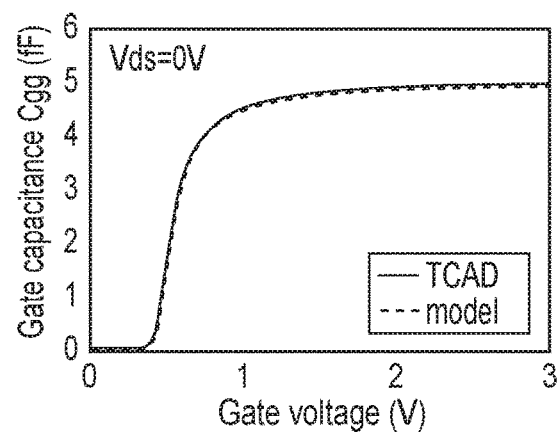
FIG. 8(b) represents the evolution of gate capacitance versus gate voltage, of the stacked nanowire GAA MOSFET of FIG. 8(a), obtained by a method according to one embodiment of the invention and by a simulation of the prior art.
Figure 9A:
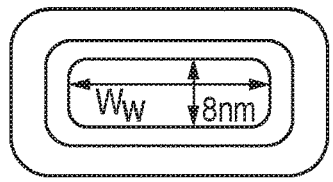
FIG. 9(a) represents a single nanosheet GAA MOSFET to which a method according to one embodiment of this invention is applied.
Figure 9B:
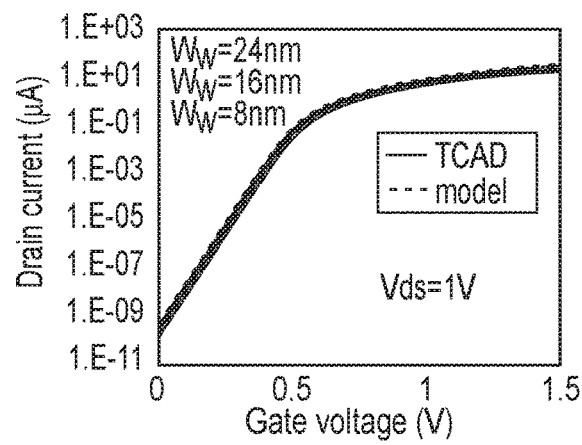
FIG. 9(b) represents the evolution of drain current versus gate voltage, of the nanosheet GAA MOSFET of FIG. 9(a), obtained by a method according to one embodiment of the invention and by a simulation of the prior art.
Figure 10A:
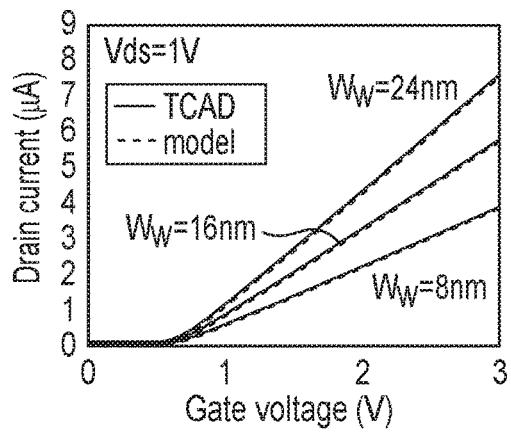
FIG. 10(a) represents the evolution of current versus voltage gate, in linear regime, of a single nanosheet GAA MOSFET for several values of nanosheet width $W_w$, obtained by a method according to one embodiment of the invention and by a simulation of the prior art.
Figure 10B:
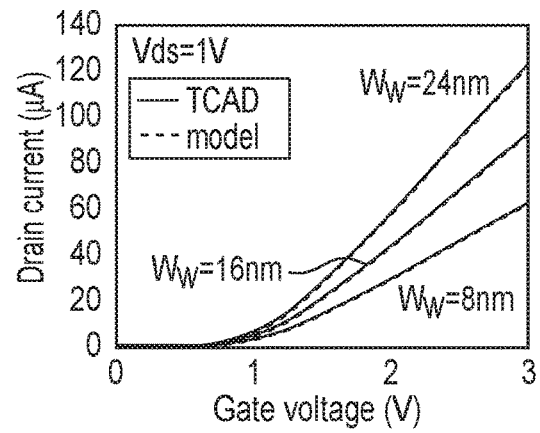
FIG. 10(b) represents the evolution of current versus voltage gate, in saturation regime, of a single nanosheet GAA MOSFET for several values of nanosheet width $W_w$, obtained by a method according to one embodiment of the invention and by a simulation of the prior art.
Figure 11A:
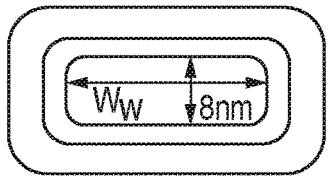
FIG. 11(a) represents a single nanosheet GAA MOSFET to which a method according to one embodiment of the invention is applied.
Figure 11B:
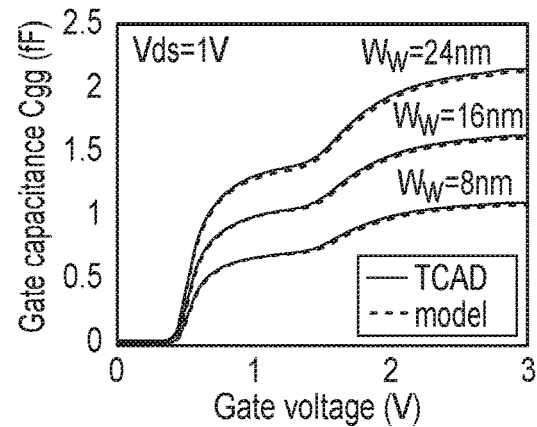
FIG. 11(b) represents total gate capacitance versus gate voltage in saturation regime of the MOSFET of FIG. 11(a), when obtained by a method according to one embodiment of the invention and according to the prior art.
Figure 12A:
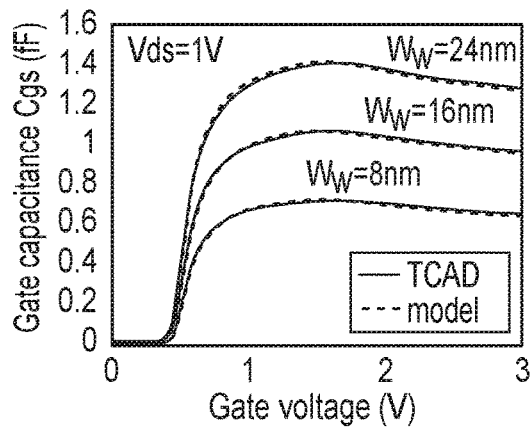
FIG. 12(a) represents gate to source capacitance versus gate voltage in saturation of the MOSFET of FIG. 11(a), obtained by a method according to one embodiment of the invention and according to the prior art.
Figure 12B:
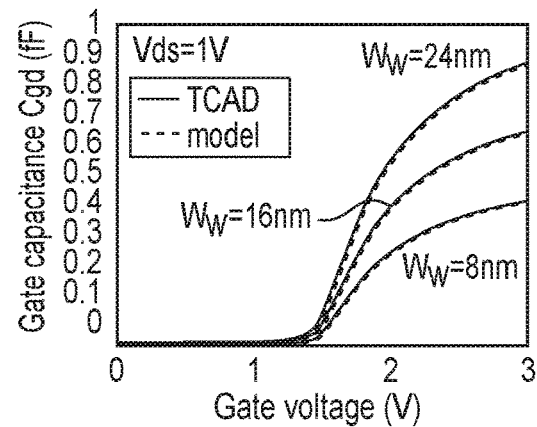
FIG. 12(b) represents gate to drain capacitance versus gate voltage in saturation of the MOSFET of FIG. 11(a), obtained by a method according to one embodiment of the invention and according to the prior art.
Figure 13A:
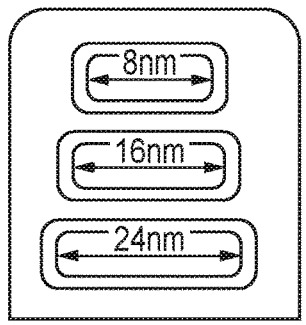
FIG. 13(a) represents a stacked nanosheet GAA MOSFET to which a method according to one embodiment of the invention is applied.
Figure 13B:
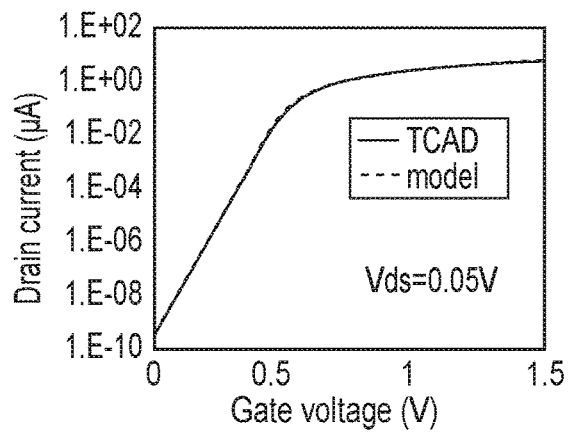
FIG. 13(b) represents channel current versus gate voltage in linear regime with logarithm scale, of the MOSFET of FIG. 13(a), obtained by a method according to one embodiment of the invention and according to the prior art.
Figure 14A:
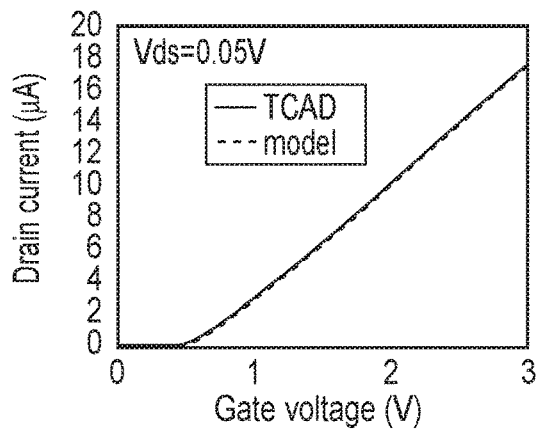
FIG. 14(a) represents channel current versus gate voltage in linear regime with linear scale, of the MOSFET of FIG. 13(a), determined by a method according to one embodiment of the invention and according to the prior art.
Figure 14B:
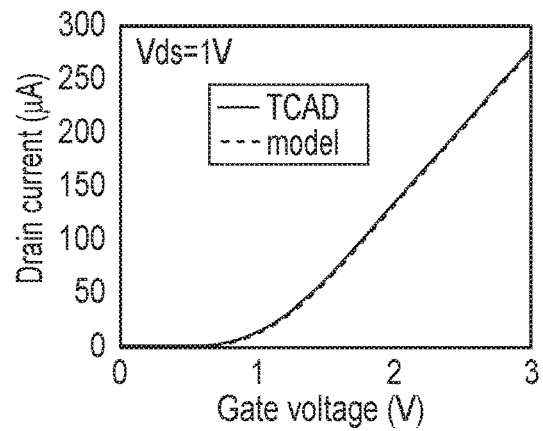
FIG. 14(b) represents channel current versus gate voltage in saturation regime with linear scale of the MOSFET of FIG. 13(a), determined by a method according to one embodiment of the invention and according to the prior art.
Figure 15A:
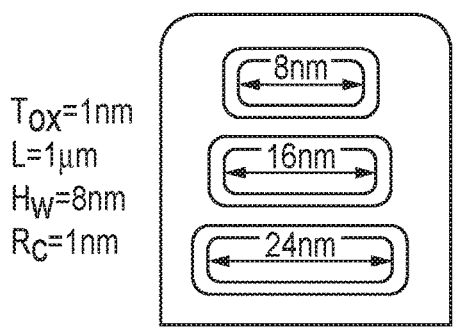
FIG. 15(a) represents a stacked nanosheet GAA MOSFET to which a method according to one embodiment of the invention is applied.
Figure 15B:
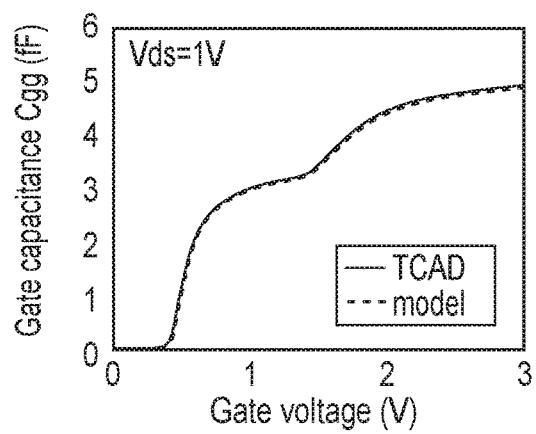
FIG. 15(b) represents the total gate capacitance versus gate voltage in saturation regime of the MOSFET of FIG. 15(a), determined by a method according to one embodiment of the invention and according to the prior art.
Figure 16A:
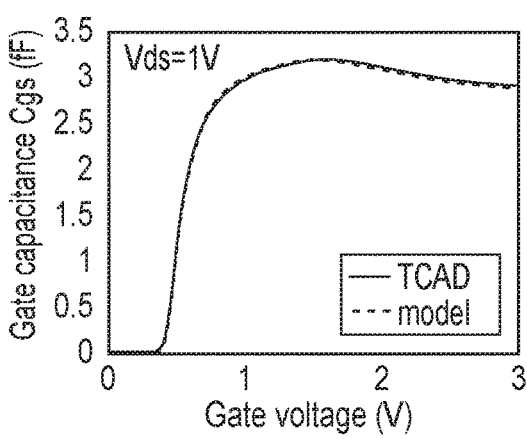
FIG. 16(a) represents the gate to source capacitance versus gate voltage in saturation regime of the MOSFET of FIG. 15(a), determined by a method according to one embodiment of the invention and according to the prior art.
Figure 16B:
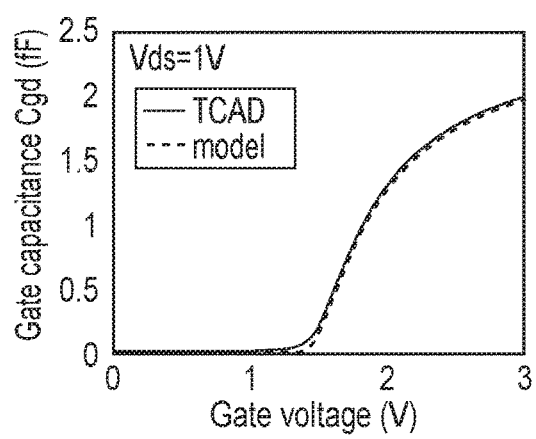
FIG. 16(b) represents the gate to drain capacitance versus gate voltage in saturation regime of the MOSFET of FIG. 15(a), determined by a method according to one embodiment of the invention and according to the prior art.

FIG. 3 represents an enlarged view of a nanowire 11 of the stacked nanowire MOSFET of FIGS. 1 and 2.

Each nanowire may have different shapes: it may have a rectangular section with rounded corners (nanosheet), a cylindrical section (nanowire) or a square section (nanowire). Each nanowire/nanosheet i has a width $W_{w,i}$ and a height $H_{w,i}$. In case of rounded corners, each rounded corner has a radius $R_{c,i}$.

A method according to one embodiment of the invention will now be described by reference to FIGS. 4 to 15(b).

This method may be implemented by a computer comprising at least one interface, at least one physical processor and a non-transitory memory (also broadly referred to as a non-transitory machine readable or storage medium). The computer is a special purpose computer as it is programmed to perform the specific calculation steps of the method. The non-transitory memory is encoded or programmed with specific code instructions for carrying out the calculation steps. In particular, calculation steps described above can be carried out using code instructions embedded in the non-transitory memory. The non-transitory memory is arranged in communication with the at least one physical processor so that the at least one physical processor, in use, reads and executes the specific code instructions embedded in the non-transitory memory. The interface of the special purpose computer is arranged in communication with the at least one physical processor and receives input parameters that are processed by the at least one physical processor.

Having described and illustrated the principles of the invention with reference to various embodiments, it will be recognized that the various embodiments can be modified in arrangement and detail without departing from such principles. It should be understood that the programs, processes, or methods described herein are not related or limited to any particular type of computing environment, unless indicated otherwise. Various types of specialized computing environments may be used with or perform operations in accordance with the teachings described herein. Elements of embodiments shown in software may be implemented in hardware and vice versa.

The devices, processors or processing devices described herein may be configured to execute one or more sequences of one or more instructions contained in a main memory or a computer readable medium. Execution of the sequences of instructions contained in a main memory or a computer readable medium causes the processor to perform at least some of the process steps described herein. One or more processors in a multi-processing arrangement may also be employed to execute the sequences of instructions contained in a main memory or a computer readable medium. In alternative embodiments, hard-wired circuitry may be used in place of or in combination with software instructions. Thus, embodiments are not limited to any specific combination of hardware circuitry and software.

The term "computer readable medium" as used herein refers to any physical medium that participates in providing instructions to a processor for execution. Such a medium may take many forms, including but not limited to, non-volatile media, volatile media, and transmission media. Non-volatile media include, for example, optical or magnetic disks. Volatile media include dynamic memory. Transmission media include coaxial cables, copper wire and fiber optics. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, or any other medium from which a computer can read.

Various forms of computer readable media may be involved in carrying one or more sequences of one or more instructions to the at least one processor for execution.

It will be appreciated that the method described herein represents a solution to the technological problem currently faced by skilled artisans in designing gate transistors encasing stacked nanowires MOSFET that satisfy consumption, performance, and/or surface technology constraints. The method described herein is greatly beneficial as it permits determination of at least one intrinsic parameter of a stacked nanowires/nanosheets MOSFET.

The method enables to determine the surface potential in the channel at source and/or drain side in the stacked nanowires/nanosheet GAA MOSFET of FIGS. 1 to 3.

The determination of surface potential at the source side and the determination of surface potential at the drain side are carried out with the same procedure, the only difference between both determination being the bias of the considered electrode (source or drain). In the following, we will thus use an electrode bias $V_x$ that corresponds either to source or to drain bias.

Input Parameters:

The method comprises first a step 101 of receiving, using the interface, a set of input parameters describing the effective geometry of the stacked nanowire MOSFET 10 and the process device parameters, the effective biases $V_g$ and $V_x$ on the gate and the source or drain, and the temperature. The set of input parameters received by the interface is summarized in Tables 1, 2 and 3 below.

The definitions of all geometrical parameters are given in the tables 1 and 2.

TABLE 1

Effective device geometrical parameters

| Notation | Unit | Description |
|---|---|---|
| $N_w$ | — | Number of stacked nanowires/nanosheets |
| L | m | Effective gate length |
| $H_{w,i}$ | m | Effective thickness of the nanowire/nanosheet number i (i = 1 to $N_w$) |
| $W_{w,i}$ | m | Effective width of the nanowire/nanosheet number i (i = 1 to $N_w$) |
| $R_{c,i}$ | m | Effective corner radius of the nanowire/nanosheet number i (i = 1 to $N_w$) |
| $T_{ox}$ | m | Effective gate dielectric equivalent oxide thickness |

TABLE 2

Process device parameters.

| Notation | Unit | Description |
|---|---|---|
| $\varepsilon_{ox}$ | F/m | Gate dielectric permittivity |
| $\varepsilon_{ch}$ | F/m | Channel dielectric permittivity |
| $n_{ch}$ | $m^{-3}$ | Intrinsic channel doping concentration |
| $\Delta\phi_m$ | eV | Gate workfunction with respect to the midgap level of the nanowires/nanosheets |

The effective biases on the electrodes and the channel temperature are given in the table 3.

TABLE 3

Effective biases and temperature.

| Notation | Unit | Description |
|---|---|---|
| $V_g$ | V | Effective gate bias |
| $V_x$ | V | Effective source or drain bias |
| T | °K | Channel temperature |

Table 4 provides all physical constants used in the method.

TABLE 4

Physical constants.

| Notation | Unit | Description |
|---|---|---|
| $k_B$ | $J.K^{-1}$ | Boltzmann constant |
| q | C | Elementary charge |
| π | — | Mathematical constant = 3.141592654 |

Calculation of Normalized Quantities:

The method may then comprise a step 102 of calculation of normalized quantities:

Normalized gate potential: $x_g = (V_g - \Delta\phi_m)/\phi_T$
Normalized source or drain potential: $x_n = V_x/\phi_T$
Normalized surface potential: $x = \varphi_s/\phi_T$
Normalized charge: $q = Q/(C_{ox} \cdot \phi_T)$
With $\phi_T$ the thermal voltage given by: $\phi_T = k_B T/q$ Even if this step is not mandatory, it enables to reduce the number of variables/parameters in the equations. So, with this step, the computing time is improved.

Determination of the Potential Surface:

The method is based on the resolution, using the physical processor, of the following equation:

$$(x_g - x)^2 + B_{sp} \cdot (x_g - x) = \Delta_f \exp(x - x_n) \quad [\text{Eq. 1}]$$

Where x is the surface potential normalized by a thermal voltage $\phi_T$ given by $\phi_T = k_B T/q$, $B_{sp}$ and $\Delta_f$ are constants depending on the geometry of the stacked nanowires MOSFET, $x_g$ is an effective gate bias.

Determination of Constants $B_{sp}$ and $\Delta_f$

To do that, the method comprises a step 103 of determining, using the physical processor, constants $B_{sp}$ and $\Delta_f$ according to the parameters received by the interface.

The constants $B_{sp}$ and $\Delta_f$ are given by:

$$B_{sp} = \frac{4 \cdot \varepsilon_{ch}}{H_{sp} \cdot C'_{ox}} \quad [\text{Eq. 2}]$$

$$\Delta_f = \frac{2 \cdot q \cdot n_{ch} \cdot \varepsilon_{ch}}{\phi_T \cdot C'^2_{ox}}$$

Where $C_{ox}'$ is a total equivalent gate oxide capacitance of the stacked nanowires/nanosheets GAA MOSFET and $H_{sp}$ is a total equivalent film thickness of the stacked nanowires/nanosheets GAA MOSFET.

The method comprises then a step 104 of calculating, using the physical processor, the total equivalent gate oxide capacitance $C_{ox}'$ and the total equivalent film thickness $H_{sp}$ of the stacked nanowires/nanosheets GAA MOSFET.

To that purpose, each nanowire i is partitioned in three parts as illustrated on FIG. 3:

A central part that will be treated as a symmetrical double gate transistor;
two corners parts on each side of the central part, each corner part being considered as a cylindrical transistor.

Each corner part has a width $H_{w,i}/2$.

Some specific cases can be noted and summarized by the table 5.

TABLE 5

Specific cases of nanowires/nanosheet structures.

| Case | $R_{c,i}$ | $W_{w,i}$ |
|---|---|---|
| Cylindrical nanowire = | $H_{w,i}/2$ = | $H_{w,i}$ |
| Square nanowire = | 0 = | $H_{w,i}$ |
| Cylindrical nanosheet = | $H_{w,i}/2$ | — |
| Rectangular nanosheet = | 0 | — |

The method comprises first a step 105 of computing, using the physical processor, for each nanowire or nanosheet, an effective channel width $W_{effnw,i}$ corresponding to the perimeter of a transversal section of each nanowire. The effective channel width $W_{effnw,i}$ may be given by:

$$W_{effnw,i} = 2 \cdot (W_{w,i} - H_{w,i}) + 2 \cdot \pi \cdot R_{c,i} + 2 \cdot (H_{w,i} - 2 \cdot R_{c,i}) \quad [\text{Eq. 3}]$$

The method comprises then a step 106 of computing, for each oxide layer, using the physical processor, an effective gate oxide width $W_{oxnw,i}$, corresponding to the perimeter of a transversal section of each oxide layer. The effective gate oxide width $W_{oxnw,i}$ may be given by:

$$W_{oxnw,i} = 4 \cdot \left( \frac{2 \cdot T_{ox} \cdot dS_{0,i}}{\ln\left(\frac{r'_{max,i}}{r'_{min,i}}\right)} + H_{w,i} - 2 \cdot R_{clim,i} \right) + W_{effcent,i} \quad [\text{Eq. 4}]$$

With:

$$R_{clim,i} = \max\left(R_{c,i}, \frac{T_{ox}}{2}\right)$$

$$r_{0,i} = R_{clim,i} + \frac{T_{ox}}{2}$$

$$dR_{clim,i} = R_{clim,i} - R_{c,i}$$

$$r_{0min,i} = \sqrt{r_{0,i}^2 + dR_{clim,i}^2}$$

$$r_{0max,i} = (\sqrt{2} - 1) \cdot dR_{clim,i} + r_{0,i}$$

$$\theta_{0,i} = \arctan\left(\frac{r_{0,i} - dR_{clim,i}}{r_{0,i} + dR_{clim,i}}\right)$$

$$lr_{0,i} = \ln\left(\frac{dR_{clim,i} + r_{0min,i}}{r_{0,i}}\right)$$

$$S_{0,i} = r_{0,i} \cdot lr_{0,i} + \frac{r_{0min,i} + 2 \cdot r_{0max,i}}{3} \cdot \theta_{0,i}$$

$$dS_{0,i} = llr_{0,i} + \frac{1}{3} \cdot \left(\frac{r_{0,i}}{r_{0min,i}} + 2\right) \cdot \theta_{0,i} + \frac{2}{3} \cdot (r_{0max,i} - r_{0min,i}) \cdot \frac{dR_{clim,i}}{r_{0min,i}^2}$$

$$r'_{min,i} = dS_{0,i} \cdot (R_{clim,i} - r_{0,i}) + S_{0,i}$$

$$r'_{max,i} = r'_{min,i} + dS_{0,i} \cdot T_{ox}$$

The method comprises then a step 107 of computing, using the physical processor, an equivalent normalized gate oxide $C_{oxnw,i}$ for each nanowire. The equivalent normalized gate oxide $C_{oxnw,i}$ is given by:

$$C_{oxnw,i} = \frac{\varepsilon_{ox}}{T_{ox}} \cdot \frac{W_{oxnw,i}}{W_{effnw,i}} \quad [\text{Eq. 5}]$$

The method comprises then a step 108 of computing, using the physical processor, an equivalent semiconductor film thickness $H_{spnw,i}$, for each nanowire:

$$H_{spnw,i} = \frac{W_{effcent,i}}{W_{effnw,i}} \cdot H_{w,i} + \frac{2 \cdot W_{effcorn,i}}{W_{effnw,i}} \cdot \frac{2 \cdot H_{w,i}}{\pi} \cdot \quad [\text{Eq. 6}]$$

$$\left\{ \ln\left(\left(1 - 2 \cdot \frac{R_{c,i}}{H_{w,i}}\right) + \sqrt{1 + \left(1 - 2 \cdot \frac{R_{c,i}}{H_{w,i}}\right)^2}\right) + \right.$$

$$\left. \frac{\sqrt{1 + \left(1 - 2 \cdot \frac{R_{c,i}}{H_{w,i}}\right)^2} + 2 \cdot \left((\sqrt{2} - 1) \cdot \left(1 - 2 \cdot \frac{R_{c,i}}{H_{w,i}}\right) + 1\right)}{3} \cdot a\tan\left(\frac{\frac{R_{c,i}}{H_{w,i}}}{1 - \frac{R_{c,i}}{H_{w,i}}}\right) \right.$$

The method comprises then a step 109 of computing, using the physical processor, a total effective width of the structure $W_{eff}$ given by:

$$W_{eff} = \sum_{i=1}^{N_w} W_{effnw,i} \quad [\text{Eq. 7}]$$

The method comprises then a step 110 of computing, using the physical processor an total equivalent normalized gate oxide $C_{ox}'$ given by:

$$C_{ox}' = \sum_{i=1}^{N_w} \frac{W_{effnw,i}}{\sum_{i=1}^{N_w} W_{effnw,i}} \cdot C_{oxnw,i}' \quad [\text{Eq. 8}]$$

The method also comprises a step 111 of computing, using the physical processor, an equivalent semiconductor film thickness $H_{sp}$ given by:

$$H_{sp} = \sum_{i=1}^{N_w} \frac{W_{effnw,i}}{\sum_{i=1}^{N_w} W_{effnw,i}} \cdot H_{spnw,i} \quad [\text{Eq. 9}]$$

Constants $B_{sp}$ and $\phi_f$ are then determined using the physical processor during step 103:
The constants $B_{sp}$ and $\Delta_f$ are given by:

$$B_{sp} = \frac{4 \cdot \varepsilon_{ch}}{H_{sp} \cdot C_{ox}'} \quad [\text{Eq. 10}]$$

$$\Delta_f = \frac{2 \cdot q \cdot n_{ch} \cdot \varepsilon_{ch}}{\phi_T \cdot C_{ox}'^2}$$

The method comprises then a step 104 of determining a normalized surface potential x that solve the following equation:

$$(x_g - x)^2 + B_{sp} \cdot (x_g - x) = \Delta_f \cdot \exp(x - x_n) \quad [\text{Eq. 11}]$$

With $\Delta_f = \frac{2 \cdot q \cdot n_{ch} \cdot \varepsilon_{ch}}{\Phi_T \cdot C_{ox}'^2}$ and $B_{sp} = \frac{4 \cdot \varepsilon_{ch}}{H_{sp} \cdot C_{ox}'}$ This equation may be solved by using a successive error calculation similarly to the work of T. L. Chen and G. Gildenblat (publication in Solid-State Electronics, vol. 45, 2001).

According to this embodiment, a normalized threshold voltage $x_{th}$ is first determined by using the physical processor. The normalized threshold voltage $x_{th}$ is given by:

$$x_{th} = \ln\left(\phi_T \cdot C_{ox}'^2 \cdot \frac{2 + B_{sp}}{q \cdot n_{ch} \cdot \varepsilon_{ch}}\right) + x_n \quad [\text{Eq. 12}]$$

The method comprises then a step of determining a normalized surface potential approximation $x_0$ given by:

$$x_0 = \text{Min\_func}(x_{0si}, x_g, 1) \quad [\text{Eq. 13}]$$

With:

$$x_{gt0} = x_g - x_{th} - 1$$

$$x_{gt0eff} = \frac{1}{2} \cdot \left(x_{gt0} + \sqrt{x_{gt0}^2 + 10}\right)$$

$$x_{0si} = x_n + \ln\left(x_{gt0eff} \cdot \frac{x_{gt0eff} + B_{sp}}{\Delta_f}\right)$$

Min_func(x, y, a) can be defined by: Min_func(x, y, a) =

$$\frac{1}{2} \cdot \left(x + y - \sqrt{(x-y)^2 + a}\right)$$

The method comprises then a step of computing, using the physical processor a normalized surface potential xi using a first error calculation given by:

$$x_1 = x_0 + \frac{\lambda \cdot a_s}{\mu - \frac{\lambda \cdot b_s}{\mu} \cdot \left(\frac{b_s^2}{3} - a_s\right)} \quad [\text{Eq. 14}]$$

With:

$$a_{s0} = x_g \cdot (x_g + B_{sp})$$

$$a_{s1} = 2 \cdot x_g + B_{sp}$$

$$a_s = x_0^2 - a_{s1} \cdot x_0 + a_{s0}$$

$$b_s = 2 \cdot x_0 - a_{s1}$$

$$\alpha = x_n - x_0 + \ln\left(\frac{a_s}{\Delta_f}\right)$$

$$\lambda = a_s - b_s$$

$$\mu = \frac{\lambda^2}{\alpha} + \frac{b_s^2}{2} - a_s$$

The method comprises then a step of computing, using the physical processor, a final normalized surface potential x using a second error calculation:

$$x = x_1 + \frac{2 \cdot \rho}{\omega + \sqrt{\omega^2 - 2 \cdot \rho \cdot (2 \cdot \Delta_f \cdot \exp(x_1 - x_n))}} \quad [\text{Eq. 15}]$$

With:

$$\omega = 2 \cdot (x_g - x_1) + B_{sp} + \Delta_f \cdot \exp(x_1 - x_n)$$

$$\rho = (x_g - x_1)^2 + B_{sp} \cdot (x_g - x_1) - \Delta_f \cdot \exp(x_1 - x_n)$$

The surface potential at the source side $x_s$ is then given by:

$$x_s = x \text{ for } x_n = x_{n,s} = V_s/\phi_T \quad [\text{Eq. 16}]$$

The surface potential at the drain side $x_d$ is then given by:

$$x_d = x \text{ for } x_n = x_{n,d} = V_d/\phi_T \quad [\text{Eq. 17}]$$

The method may then comprise a step 112 of determining, using the physical processor, a channel current and/or a step 113 of determining, using the physical processor, a channel charge thanks to the knowledge of the surface potential at the source and at the drain side. Channel current and channel charge may be determined by several methods. According to one embodiment, the following method may be used.

Determination of Drain Current:

The method comprises first a step of determining the normalized inversion charge given by:

$$q_i = x_g - x \quad [\text{Eq. 18}]$$

In order to have a symmetrical model when the drain-source are reversed, the charge is considered as being:

$$q_i = q_{im} + (x_m - x) \quad [\text{Eq. 19}]$$

Where $x_m$ and $q_{im}$ are the mid-point surface potential and inversion, respectively.

$$q_{im} = x_g - x_m \quad [\text{Eq. 20}]$$

$$x_m = \frac{x_d + x_s}{2} \quad [\text{Eq. 21}]$$

The drain current can be calculated considering the variation of the channel voltage (or quasi-level Fermi) $V_c$ by:

$$I_d = -W \cdot \mu \cdot C'_{ox} \cdot \phi_T^2 \cdot q_i \frac{dx_n}{dy} \quad [\text{Eq. 22}]$$

The method comprises then a step of integrating this last equation between the source and the drain:

$$I_d = -\frac{W}{L} \cdot \mu \cdot \int_{V_s}^{V_d} Q_i dV_c \quad [\text{Eq. 23}]$$

W, L and μ are the channel width, channel length and the mobility, respectively.

Using normalized units, the drain current calculation becomes:

$$I_d = -\frac{W}{L} \cdot \mu \cdot C'_{ox} \cdot \phi_T^2 \cdot \int_{x_{n,s}}^{x_{n,d}} q_i dx_n \quad [\text{Eq. 24}]$$

The method comprises then a step of integrating the surface potential:

$$I_d = -\frac{W}{L} \cdot \mu \cdot C'_{ox} \cdot \phi_T^2 \cdot \int_{x_s}^{x_d} q_i \frac{dx_n}{dx} dx \quad [\text{Eq. 25}]$$

The method comprises then a step of computing the derivate $dx_n/dx$ by using equation [Eq. 1] at $x = x_m$.

Using equation [Eq. 1]:

$$\frac{d}{dx}((x_g - x)^2 + B_{sp} \cdot (x_g - x)) = \Delta_f \cdot \frac{d}{dx}(\exp(x - x_n)) \quad [\text{Eq. 26}]$$

So, $$-2 \cdot (x_g - x) - B_{sp} = \Delta_f \cdot \left(1 - \frac{dx_n}{dx}\right) \cdot \exp(x - x_n) \quad [\text{Eq. 27}]$$

At $x = x_m$:

$$\chi_m = 1 + \frac{2 \cdot (x_g - x_m) + B_{sp}}{\Delta_f \cdot \Delta_m} \quad [\text{Eq. 28}]$$

with $$\Delta_m = \exp(x_m - x_{n,m}) \quad [\text{Eq. 29}]$$

$x_{nm}$ is the channel voltage at the mid-point surface potential.

The method comprises then a step of computing $\Delta_m$, by using equation [Eq. 1], at the mid-point surface potential:

$$(x_g - x_m)^2 + B_{sp} \cdot (x_g - x_m) = \Delta_f \cdot \exp(x_m - x_{n,m}) = \Delta_f \Delta_m \quad [\text{Eq. 30}]$$

The surface potential at the source side:

$$(x_g - x_s)^2 + B_{sp} \cdot (x_g - x_s) = \Delta_f \Delta_s \quad [\text{Eq. 31}]$$

With:

$$\Delta_s = \exp(x_s - x_{n,s}) \quad [\text{Eq. 32}]$$

The surface potential at the drain side:

$$(x_g - x_d)^2 + B_{sp} \cdot (x_g - x_d) = \Delta_f \Delta_d \quad [\text{Eq. 33}]$$

With:

$$\Delta_d = \exp(x_d - x_{n,d}) \quad [\text{Eq. 34}]$$

The method comprises then a step of computing, using the physical processor:

2×[Eq. 30]−[Eq. 31]−[Eq. 33]

$$2 \cdot x_m^2 - x_d^2 - x_s^2 = \Delta_f \cdot (2 \cdot \Delta_m - \Delta_d - \Delta_s) \quad [\text{Eq. 35}]$$

After some arrangements:

$$\Delta_m = \frac{\Delta_d + \Delta_s}{2} - \frac{1}{4 \cdot \Delta_f} \cdot x_{ds}^2 \quad [\text{Eq. 36}]$$

The method comprises then a step of computing the drain current calculation [Eq. 25] by using $x_m$:

$$I_d = -\frac{W}{L} \cdot \mu \cdot C'_{ox} \cdot \phi_T^2 \cdot \chi_m \cdot \int_{x_s}^{x_d} q_i dx \quad [\text{Eq. 37}]$$

The drain current is then expressed by using equation [Eq. 19]:

$$I_d = -\frac{W}{L} \cdot \mu \cdot C'_{ox} \cdot \phi_T^2 \cdot q'_{im} \cdot x_{ds} \quad [\text{Eq. 38}]$$

With:

$$q'_{im} = \chi_m \cdot q_{im} \quad [\text{Eq. 39}]$$

Determination of Drain Current in Case of Low Gate Voltage

When the gate voltage is near to the flatband voltage, the values of the surface potential are very low. The calculation of $x_{ds}$ becomes sensitive and is calculated differently.

In general case, the surface potentials at the source and drain sides are defined by the equation [Eq. 1]:

$$(x_g - x_s)^2 + B_{sp} \cdot (x_g - x_s) = \Delta_f \cdot \exp(x_s - x_{n,s}) \quad [\text{Eq. 40}]$$

$$(x_g - x_d)^2 + B_{sp} \cdot (x_g - x_d) = \Delta_f \cdot \exp(x_d - x_{n,d}) \quad [\text{Eq. 41}]$$

The difference between these two equations is:

$$(x_g - x_d)^2 - (x_g - x_s)^2 - B_{sp} \cdot (x_d - x_s) = \Delta_f \cdot (\exp(x_d - x_{n,d}) - \exp(x_s - x_{n,s})) \quad [\text{Eq. 42}]$$

So, $$(x_{ds} - B_{sp} - 2 \cdot (x_g - x_s)) \cdot x_{ds} = \Delta_f \Delta_s \cdot (\exp(x_{ds} - x_{n,ds}) - 1) \quad [\text{Eq. 43}]$$

With:

$$x_{n,ds} = x_{n,d} - x_{n,s} \quad [\text{Eq. 44}]$$

When $\Delta_f \Delta_s$ is low, i.e. inferior to $10^{-6}$, the surface potential difference $x_{ds}$ cannot be accurately calculated. Consequently, if $(\Delta_f \Delta_s) < 10^{-6}$, the method uses the following approximation:

At low gate voltage:

$$x_{ds} - B_{sp} - 2 \cdot (x_g - x_s) \approx -B_{sp} \quad [\text{Eq. 45}]$$

So, $$-B_{sp} \cdot x_{ds} \approx \Delta_f \Delta_s \cdot (\exp(-x_{n,ds}) - 1) \quad [\text{Eq. 46}]$$

Finally:

$$x_{ds} \approx \frac{\Delta_f \cdot \Delta_s}{B_{sp}} \cdot (1 - \exp(-x_{n,ds})) \quad [\text{Eq. 47}]$$

With $$\Delta_s \approx \exp(x_g) \quad [\text{Eq. 48}]$$

We have:

$$x_{ds} \approx \frac{\Delta_f}{B_{sp}} \cdot \exp(x_g) \cdot (1 - \exp(-x_{n,ds})) \quad [\text{Eq. 49}]$$

In addition, when $x_g < 0$, the channel is in weak inversion. Using [Eq. 30], the mid-point inversion charge can be approximated by:

$$q_{im} \approx \frac{\Delta_f}{B_{sp}} \cdot \Delta_m \quad [\text{Eq. 50}]$$

The effective inversion charge $q_{im}'$ is given by the equation [eq. 39].

Using equation [Eq. 28] and the previous approximation:

$$q_{im}' \approx \left(1 + \frac{2 \cdot q_{im} + B_{sp}}{\Delta_f \cdot \Delta_m}\right) \cdot q_{im} \quad [\text{Eq. 51}]$$

So, $$q_{im}' \approx q_{im} + \frac{2 \cdot q_{im}^2 + B_{sp} \cdot q_{im}}{\Delta_f \cdot \Delta_m} \quad [\text{Eq. 52}]$$

Using equation [eq. 30], $q_{im}'$ is given by:

$$q_{im}' \approx q_{im} + \frac{q_{im}^2 + \Delta_f \cdot \Delta_m'}{\Delta_f \cdot \Delta_m} \approx q_{im} + \frac{q_{im}^2}{\Delta_f \cdot \Delta_m} + 1 \quad [\text{Eq. 53}]$$

With $q_{im} \ll 1$:

$$q_{im}' \approx 1 \quad [\text{Eq. 54}]$$

Determination of Drain Current in Case of Low Drain Voltage $x_{Ds}$

At low drain voltages, $x_{ds}$ has a low values, its exponential can be approximated into the equation [Eq. 43] with the first order Taylor's development:

$$(x_{ds} - B_{sp} - 2 \cdot (x_g - x_s)) \cdot x_{ds} = \Delta_f \Delta_s \cdot ((1 + x_{ds}) \cdot \exp(-x_{n,ds}) - 1) \quad [\text{Eq. 55}]$$

After some arrangements:

$$(x_{ds} - A_{ds}) \cdot x_{ds} + \Delta_f \Delta_s \cdot (1 - \exp(-x_{n,ds})) = 0 \quad [\text{Eq. 56}]$$

With, $$A_{ds} = B_{sp} + 2 \cdot (x_g - x_s) + \Delta_f \Delta_s \cdot \exp(-x_{n,ds}) = 0 \quad [\text{Eq. 57}]$$

Also with $x_{ds} \ll A_{ds}$ and $\exp(-x_{n,ds}) \approx 1$, we find:

$$x_{ds} \approx \frac{\Delta_f \cdot \Delta_s}{A_{ds}} \cdot (1 - \exp(-x_{n,ds})) \quad [\text{Eq. 58}]$$

With, $$A_{ds} = B_{sp} + 2 \cdot (x_g - x_s) + \Delta_f \cdot \Delta_s \quad [\text{Eq. 59}]$$

Determination of Channel Charges:
Total Normalized Inversion Charge $q_{inv}$

The total inversion charge is obtained by the integration of the inversion charge $q_i$ along the channel:

$$q_{inv} = \frac{1}{L} \cdot \int_0^L q_i \, dy \quad [\text{Eq. 60}]$$

The integration between the surface potentials at the drain and at the source sides is also given by:

$$q_{inv} = \frac{1}{L} \cdot \int_{x_s}^{x_d} q_i \cdot \frac{dy}{dx} dx \quad [\text{Eq. 61}]$$

The method comprises a step of evaluating the reverse of the derivative of the surface potential $x$ with the position $y$.

To do this, it is possible to consider that the current in the channel doesn't depend on the position.

In inversion, the drain current given by the equation [Eq. 38] is equal to drain current:

$$I_d = -W \cdot \mu \cdot C_{ox}' \cdot \phi_T^2 \cdot q_i \cdot \frac{dx_n}{dy} \quad [\text{Eq. 62}]$$

Which is equivalent to:

$$\frac{1}{L} \cdot q_{im}' \cdot x_{ds} = q_i \cdot \frac{dx_n}{dy} = q_i \cdot \frac{dx_n}{dx} \cdot \frac{dx}{dy} \quad [\text{Eq. 63}]$$

To simplify the calculation, we use this approximation:

$$q_i \cdot \frac{dx_n}{dx} \approx q_{im}' + (x_m - x) \quad [\text{Eq. 64}]$$

So, $$\frac{1}{L} \cdot q'_{im} \cdot x_{ds} = (q'_{im} + (x_m - x)) \cdot \frac{dx}{dy} \qquad [\text{Eq. 65}]$$

After some arrangements:

$$\frac{dy}{dx} = \frac{L}{x_{ds}} \cdot \left(1 + \frac{x_m - x}{q'_{im}}\right) \qquad [\text{Eq. 66}]$$

Replacing this derivative in the equation [Eq. 61] and using equation [Eq. 19]:

$$q_{inv} = \frac{1}{L} \cdot \int_{x_s}^{x_d} (q_{im} + (x_m - x)) \cdot \frac{L}{x_{ds}} \cdot \left(1 + \frac{x_m - x}{q'_{im}}\right) dx \qquad [\text{Eq. 67}]$$

With the integration:

$$q_{inv} = \frac{1}{x_{ds}} \cdot \left[q_{im} \cdot x\left(\frac{q_{im}}{q'_{im}} + 1\right) \cdot \frac{(x - x_m)^2}{2} + \frac{(x - x_m)^3}{3 \cdot q'_{im}}\right]_{x_s}^{x_d} \qquad [\text{Eq. 68}]$$

Finally, the total normalized inversion charge is given by:

$$q_{inv} = q_{im} + \frac{x_{ds}^2}{12 \cdot q'_{im}} \qquad [\text{Eq. 69}]$$

Normalized Inversion Charge at the Drain Side $q_d$

For the calculation of the inversion charge at the drain side, the method uses:

$$q_d = \frac{1}{L} \cdot \int_0^L q_i \cdot \frac{y}{L} dy \qquad [\text{Eq. 70}]$$

Like for total inversion charge, this one can be calculated using the variation of the surface potential along the channel:

$$q_d = \frac{1}{L} \cdot \int_{x_s}^{x_d} q_i \cdot \frac{y}{L} \cdot \frac{dy}{dx} dx \qquad [\text{Eq. 71}]$$

The method uses a step of computing y/L.

Considering equation [Eq. 66], the method comprises a step of integrating between a position y along the channel and the position $y_m$ where the surface potential is equal to the mid-point surface potential $x_m$ (equation f Eq. 211):

$$\int_{y_m}^{y} dy = \int_{x_m}^{x} \frac{L}{x_{ds}} \cdot \left(1 + \frac{x_m - x}{q'_{im}}\right) dx \qquad [\text{Eq. 72}]$$

After integration, we find:

$$\frac{y - y_m}{L} = \frac{1}{x_{ds}} \cdot \left[x - \frac{(x - x_m)^2}{2 \cdot q'_{im}}\right]_{x_x}^{x} \qquad [\text{Eq. 73}]$$

Finally, $$\frac{y}{L} = \frac{y_m}{L} + \frac{1}{x_{ds}} \cdot \left(x - x_m - \frac{(x - x_m)^2}{2 \cdot q'_{im}}\right) \qquad [\text{Eq; 74}]$$

The position $y_m$ of the mid-point surface potential is obtained considering the previous equation at the source side and at the drain side:

$$0 = \frac{y_m}{L} + \frac{1}{x_{ds}} \cdot \left(x_s - x_m - \frac{(x_s - x_m)^2}{2 \cdot q'_{im}}\right) \qquad [\text{Eq. 75}]$$

$$1 = \frac{y_m}{L} + \frac{1}{x_{ds}} \cdot \left(x_d - x_m - \frac{(x_d - x_m)^2}{2 \cdot q'_{im}}\right) \qquad [\text{Eq. 76}]$$

The sum of these two last equations gives:

$$1 = \frac{2 \cdot y_m}{L} + \frac{1}{x_{ds}} \cdot \left(x_d + x_s - 2 \cdot x_m - \frac{(x_d - x_m)^2}{2 \cdot q'_{im}} - \frac{(x_s - x_m)^2}{2 \cdot q'_{im}}\right) \qquad [\text{Eq. 77}]$$

Thus, $$y_m = \frac{L}{2} \cdot \left(1 + \frac{x_{ds}}{4 \cdot q'_{im}}\right) \qquad [\text{Eq. 78}]$$

Back to the equation [Eq. 71] and using equations [Eq. 19], [Eq. 74] and [Eq. 66]:

$$q_d = \qquad [\text{Eq. 79}]$$
$$\frac{1}{L} \cdot \int_{x_s}^{x_d} (q_{im} + (x_m - x)) \cdot \left(\frac{y_m}{L} + \frac{1}{x_{ds}} \cdot \left(x - x_m - \frac{(x - x_m)^2}{2 \cdot q'_{im}}\right)\right) \cdot \frac{L}{x_{ds}} \cdot \left(1 + \frac{x_m - x}{q'_{im}}\right) dx$$

$$q_d = \frac{1}{x_{ds}^2} \cdot \int_{x_s}^{x_d} (A0 + A1 \cdot (x - x_m) + A2 \cdot (x - x_m)^2 + A3 \cdot (x - x_m)^3 + A4 \cdot (x - x_m)^4) dx \qquad [\text{Eq. 80}]$$

With:

$$A0 = \frac{y_m}{L} \cdot q_{im} \cdot x_{ds}$$

$$A1 = -\frac{y_m}{L} \cdot \left(\frac{q_{im}}{q'_{im}} + 1\right) \cdot x_{ds} + q_{im}$$

$$A2 = \frac{y_m}{L} \cdot \frac{1}{q'_{im}} \cdot x_{ds} - \frac{q_{im}}{2 \cdot q'_{im}} - \frac{q_{im}}{q'_{im}} - 1$$

$$A3 = \frac{1}{2 \cdot q'_{im}} \cdot \left(\frac{q_{im}}{q'_{im}} + 1\right) + \frac{1}{q'_{im}}$$

$$A4 = -\frac{1}{2 \cdot q'^2_{im}}$$

After integration, the equation [Eq. 80] becomes:

$$q_d = \frac{1}{x_{ds}^2} \cdot \left[ A0 \cdot x + A1 \cdot \frac{(x-x_m)^2}{2} + A2 \cdot \frac{(x-x_m)^3}{3} + A3 \cdot \frac{(x-x_m)^4}{4} + A4 \cdot \frac{(x-x_m)^5}{5} \right]_{x_s}^{x_d} \quad \text{[Eq. 81]}$$

Thus, $$q_d = \frac{1}{x_{ds}^2} \cdot \left( A0 \cdot x_{ds} + A2 \cdot \frac{x_{ds}^3}{12} + A4 \cdot \frac{x_{ds}^5}{80} \right) \quad \text{[Eq. 82]}$$

Replacing A0, A2 and A4 variables and using equation [Eq. 74], we obtain:

$$q_d = \frac{1}{2} \left( q_{im} - \frac{x_{ds}}{6} \cdot \left( 1 - \frac{x_{ds}}{2 \cdot q'_{im}} \cdot \left( 1 + \frac{x_{ds}}{10 \cdot q'_{im}} \right) \right) \right) \quad \text{[Eq. 83]}$$

Normalized Inversion Charge at the Source Side $q_s$
The inversion charge at the source side is:

$$q_s = q_{inv} - q_d \quad \text{[Eq. 84]}$$

Normalized Gate Charge $q_g$
The inversion charge at the gate side is:

$$q_g = q_{inv} \quad \text{[Eq. 85]}$$

Figure 17:
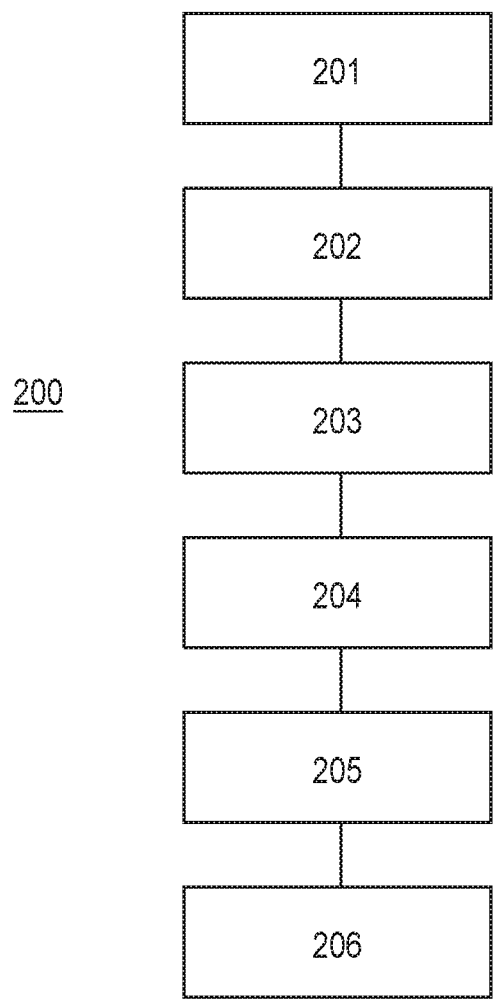
FIG. 17 is a schematic representation of one embodiment of the method according to one embodiment of the invention.

One embodiment of the computer implemented method 200 of the invention is illustrated on FIG. 17.

The method 200 comprises a first step 201 of measuring, several geometrical parameters such as the parameters presented in the table 1: the nanowires/nanosheet widths $W_{W,i}$, the number of stacked nanowires/nanosheets $N_{W,i}$, the thickness of nanowires/nanosheets $H_{W,i}$, the physical gate oxide thickness $T_{ox,p}$ and the corner radius of nanowire/nanosheet $R_{W,i}$. For this, transmission electron microscopy (TEM) may be used for instance. The first step may also include the measurement of the effective gate length L, for instance by using a top view picture of the MOSFET.

The method 200 may further comprise a step 202 of measuring the total gate capacitance value versus the gate voltage for several voltages with a drain voltage $V_{DS}$ equal to zero. The gate voltage $V_{GS}$ range shall beneficially cover all transistor regimes: weak inversion to strong inversion. Such electrical measuring step is called C-V measurements similarly to the one of FIG. 8(b). Capacitance-voltage C-V measurement is a widely used method in microelectronics technology.

The method 200 may further comprise a step 203 of calculating, using a physical processor and the above mentioned measured geometrical parameters, the normalized surface potential x as explained previously in the specification.

The method 200 may further comprise a step 204 of determining the normalized inversion and gate charge as explained previously in the specification (see for instance Equation 85).

The method 200 may further comprise a step 205 of calculating the total gate capacitance based on the derivative of the gate charge previously determined. Said calculation may be repeated for several gate voltages in order to obtain a calculated total gate capacitance versus the gate voltage for several voltages with a drain voltage $V_{DS}$ equal to zero.

The method 200 may further comprise a step 206 of comparing the calculated total gate capacitance obtained in step 205 with the measured total gate voltage obtained in step 202.

The steps 203 to 206 may be repeated, for instance by varying the value of the equivalent gate oxide $T_{ox}$, in order to fit the calculated total gate capacitance obtained in step 205 with the measured total gate voltage obtained in step 202. Once the calculated total gate capacitance obtained in step 205 and the measured total gate voltage obtained in step 202 are fitted, one can extract a value of the equivalent gate oxide $T_{ox}$ that is very relevant.

Using the equivalent thickness gate oxide $T_{ox}$ from the previous step and the physical gate oxide thickness $T_{ox,p}$ extracted from step 201, the physical gate oxide permittivity $\varepsilon_{ox,p}$ can be obtained with the following formula: $\varepsilon_{ox,p} = \varepsilon_{ox} \times (T_{ox,p}/T_{ox})$ wherein $\varepsilon_{ox}$ is relative permittivity of SiO2 that may be considered as equal to 3.9.

Gate Capacitance Value Versus Gate Voltage:

As explained above, the method may comprise a step of determining the gate capacitance value versus the gate voltage. This step enables to compare the results obtained by the method according to one embodiment of the invention and the results obtained by numerical simulations such as TCAD (Technology Computer Aided Design) simulations.

FIGS. 4(a) to 15(b) represents comparison between the results obtained by the method according to one embodiment of the invention and numerical simulations, for different shapes of stacked nanowire MOSFET. As we can see, the results obtained by the two methods are very similar.

While the present invention has been particularly described with reference to the preferred embodiments, it should be readily apparent to those of ordinary skill in the art that changes and modifications in form and details may be made without departing from the scope of the invention.

What is claimed is:

1. A computer implemented method for designing an integrated circuit that includes a stacked nanowires/nanosheets gate-all-around (GAA) metal oxide semiconductor field effect transistor (MOSFET) comprising $N_w$ nanowires and/or nanosheets, each nanowire/nanosheet being surrounded in an oxide layer, the oxide layers being embedded in a common gate, wherein the method comprises the following steps:

determining at least one intrinsic parameter of the stacked nanowires/nanosheets gate-all-around (GAA) metal oxide semiconductor field effect transistor (MOSFET) by:

measuring by at least one imaging method using a microscopy device the following geometrical parameters of the MOSFET:

the number of stacked nanowires/nanosheets $N_W$, the width $W_{W,i}$ of the nanowire/nanosheet number i, i being an integer from 1 to $N_W$, the thickness of the nanowire/nanosheet $H_{W,i}$, number i, i being an integer from 1 to $N_W$, the corner radius $R_{W,i}$ of the nanowire/nanosheet number i, i being an integer from 1 to $N_W$, $R_{W,i}$;

calculating, using a physical processor and the measured geometrical parameters, a surface potential x normalized by a thermal voltage $\phi_T$ given by $\phi_T = k_B T/q$;

measuring electrically the total gate capacitance for a plurality of gate voltages;

determining, using the measured total gate capacitance and the calculated normalized surface potential, the at least one intrinsic parameter of the stacked nanowires/nanosheets MOSFET, reproducing, based on said at least one intrinsic parameter, electrical characteristics in all biasing of the stacked nanowires/nanosheets gate-all-around (GAA) metal oxide semiconductor field effect transistor (MOSFET), determining electrical properties of the integrated circuit based on the reproduced electrical characteristics, and optimizing a device architecture of the integrated circuit with regard to consumption, performance and surface technology targets based on the determined electrical properties.

2. A computer implemented method according to claim 1, wherein the normalized surface potential x satisfies the following equation:

$$(x_g - x)^2 + B_{sp} \cdot (x_g - x) = \Delta_f \exp(x - x_n)$$

Where $B_{sp}$ and $\Delta_f$ are constants depending on the geometry of the stacked nanowires/nanosheets MOSFET and $x_g$ is an effective gate bias.

3. A computer implemented method according to claim 2, further comprising a step of determining, using a physical processor, constants $B_{sp}$ and $\Delta_f$ according to geometry parameters of the stacked nanowires/nanosheets GAA MOSFET and process parameters, wherein the step of determining constants $B_{sp}$ and $\Delta_f$ comprises a step of:

determining, for each nanowire, using a physical processor, an effective channel width $W_{effnw,i}$ corresponding to a perimeter of a transversal section of the nanowire/nanosheet;

determining, for each oxide layer, using a physical processor, an effective oxide width $W_{effox,i}$ corresponding to an exterior perimeter of a transversal section of the oxide layer.

4. A computer implemented method according to claim 3, wherein the step of determining constants $B_{sp}$ and $\Delta_f$ further comprises a step of:

determining, for each oxide layer, using a physical processor, an equivalent normalized gate oxide capacitance $C_{oxnw,i}$ given by:

$$C_{oxnw,i} = \frac{\varepsilon_{ox}}{T_{ox}} \cdot \frac{W_{oxnw,i}}{W_{effnw,i}}$$

Where $\varepsilon_{ox}$ is a dielectric permittivity of the gate and $T_{ox}$ is an effective gate dielectric equivalent oxide thickness.

5. A computer implemented method according to claim 4, wherein the step of determining constants $B_{sp}$ and $\Delta_f$ further comprises a step of determining, using a physical processor, a total equivalent gate oxide capacitance $C_{ox}'$ given by:

$$C_{ox}' = \sum_{i=1}^{N_w} \frac{W_{effnw,i}}{\sum_{i=1}^{N_w} W_{effnw,i}} \cdot C_{oxnw,i}'$$

6. A computer implemented method according to claim 3, wherein the step of determining constants $B_{sp}$ and $\Delta_f$ further comprises a step of Determining, using a physical processor, an equivalent semiconductor film thickness $H_{spnw,i}$ given by:

$$H_{spnw,i} = \frac{2 \cdot (W_{W,i} - H_{W,i})}{W_{effnw,i}} \cdot H_{W,i} + \frac{2 \cdot \pi \cdot R_{c,i} + 4 \cdot (H_{W,i} - 2 \cdot R_{c,i})}{W_{effnw,i}} \cdot$$

$$\frac{2 \cdot H_{W,i}}{\pi} \cdot \left( \ln\left(1 - 2 \cdot \frac{R_{c,i}}{H_{W,i}} + \sqrt{1 + \left(1 - 2 \cdot \frac{R_{c,i}}{H_{W,i}}\right)^2}\right) + \right.$$

$$\frac{\sqrt{1 + \left(1 - 2 \cdot \frac{R_{c,i}}{H_{W,i}}\right)^2} + 2 \cdot \left((\sqrt{2} - 1) \cdot \left(1 - 2 \cdot \frac{R_{c,i}}{H_{W,i}}\right) + 1\right)}{3} \cdot a\tan$$

$$\left. \left( \frac{\frac{R_{c,i}}{H_{W,i}}}{1 - \frac{R_{c,i}}{H_{W,i}}} \right) \right)$$

Where $H_{w,i}$ is an effective thickness of the nanowire i, $W_{w,i}$ is an effective width of the nanowire i $R_{c,i}$ is an effective corner radius of the nanowire i.

7. A computer implemented method according to claim 6, wherein the step of determining constants $B_{sp}$ and $\Delta_f$ further comprises a step of determining, using a physical processor, a total equivalent film thickness $H_{sp}$ given by $$H_{sp} = \sum_{i=1}^{N_w} \frac{W_{effnw,i}}{\sum_{i=1}^{N_w} W_{effnw,i}} \cdot H_{spnw,i}$$

8. A computer implemented method according to claim 5, wherein the step of determining constants $B_{sp}$ and $\Delta_f$ further comprises a step of computing, using a physical processor, $B_{sp}$ such that $$B_{sp} = \frac{4 \cdot \varepsilon_{ch}}{H_{sp} \cdot C_{ox'}}$$

Where $\varepsilon_{ch}$ is a channel dielectric permittivity.

9. A computer implemented method according to claim 5, wherein the step of determining constants $B_{sp}$ and $\Delta_f$ further comprises a step of computing, using a physical processor, $\Delta_f$ such that $$\Delta_f = \frac{2 \cdot q \cdot n_{ch} \cdot \varepsilon_{ch}}{\phi_T \cdot C_{ox}'^2}$$

Where q is an elementary charge, $n_{ch}$ is an intrinsic channel doping concentration, $\square_{ch}$ is a channel dielectric permittivity, $\phi_T$ is a thermal voltage given by $\phi_T = k_B T/q$.

10. A computer implemented method according to claim 1, further comprising a step of determining, using a physical processor, a channel current according to the surface potential.

11. A computer implemented method according to claim 1, further comprising a step of determining, using a physical processor, a gate charge according to the surface potential.

12. A computer implemented method according to claim 11, further comprising a step of determining the total gate capacitance value according to the determined gate charge and a step of comparing the determined total gate capacitance value with the electrically measured total gate capacitance, said comparison being carried out with a plurality of gate voltages.

13. A computer implemented method according to claim 1, wherein the at least one imaging method includes a direct measurement of geometrical characteristics using one or more images via transmission electron microscopy.

14. A computer implemented method according to claim 1, wherein the electrical properties of the integrated circuit include power consumption.

* * * * *